United States Patent
Choi et al.

(10) Patent No.: US 10,409,156 B2
(45) Date of Patent: Sep. 10, 2019

(54) MOLD, IMPRINT APPARATUS, AND METHOD OF MANUFACTURING ARTICLE

(71) Applicant: CANON KABUSHIKI KAISHA, Tokyo (JP)

(72) Inventors: Byung-Jin Choi, Austin, TX (US); Mahadevan Ganapathisubramanian, Cupertino, CA (US); Naoki Murasato, Utsunomiya (JP); Yoshikazu Miyajima, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 563 days.

(21) Appl. No.: 15/003,171

(22) Filed: Jan. 21, 2016

(65) Prior Publication Data

US 2016/0236400 A1    Aug. 18, 2016

Related U.S. Application Data

(63) Continuation of application No. 14/621,822, filed on Feb. 13, 2015.

(51) Int. Cl.
    *G03F 7/00*    (2006.01)
(52) U.S. Cl.
    CPC ................. *G03F 7/0002* (2013.01)
(58) Field of Classification Search
    CPC ..................... G03F 7/0002; G03F 9/7042
    See application file for complete search history.

(56) References Cited

U.S. PATENT DOCUMENTS

| | | | | |
|---|---|---|---|---|
| 4,172,419 | A  * | 10/1979 | Munyon ................. | B41K 1/02 101/125 |
| 7,019,819 | B2 * | 3/2006 | Choi ..................... | B29C 43/003 355/53 |
| 8,016,277 | B2 * | 9/2011 | Choi ..................... | B82Y 10/00 269/58 |
| 2001/0024708 | A1 * | 9/2001 | Uchida ................. | G11B 7/2533 428/64.1 |

(Continued)

FOREIGN PATENT DOCUMENTS

JP    2010221374 A    10/2010
JP    2014-27075 A     2/2014

(Continued)

OTHER PUBLICATIONS

Krampouz—http://www.dvorsons.com/waffles/pdf/krampouz-waffle-manual-2012.pdf (Year: 2012).*

(Continued)

*Primary Examiner* — Robert C Dye
*Assistant Examiner* — Nicholas R Krasnow
(74) *Attorney, Agent, or Firm* — Rossi, Kimms & McDowell LLP

(57) ABSTRACT

A mold includes a pattern portion in which a pattern is formed, and a concave portion formed in the back surface of the pattern portion and having a size to include the pattern portion in a planar view. The edge of the pattern portion has an almost rectangular shape in the planar view. The concave portion has an almost rectangular shape with four rounded corners in the planar view. The shortest distance from each point on a side of the edge of the pattern portion to the edge of the concave portion is constant.

9 Claims, 16 Drawing Sheets

IMMEDIATELY BEFORE IMPRINTING

DURING IMPRINTING

DURING MOLD RELEASING

(56) References Cited

U.S. PATENT DOCUMENTS

| | | | |
|---|---|---|---|
| 2004/0200368 A1* | 10/2004 | Ogino | B81C 1/0046 |
| | | | 101/34 |
| 2007/0218161 A1* | 9/2007 | Nagano | B29C 45/062 |
| | | | 425/451.9 |
| 2008/0160129 A1 | 7/2008 | Resnick et al. | |
| 2010/0015270 A1 | 1/2010 | Choi et al. | |
| 2010/0123268 A1* | 5/2010 | Menard | H01L 21/6835 |
| | | | 264/293 |
| 2010/0163706 A1* | 7/2010 | Zhou | B44B 5/00 |
| | | | 249/103 |
| 2010/0244326 A1 | 9/2010 | Tokue et al. | |
| 2011/0272838 A1 | 11/2011 | Malloy et al. | |
| 2012/0267826 A1* | 10/2012 | Sakai | B29C 45/2632 |
| | | | 264/293 |
| 2013/0187309 A1* | 7/2013 | Yang | G03F 7/0002 |
| | | | 264/293 |
| 2015/0004275 A1 | 1/2015 | Miyajima et al. | |
| 2015/0338681 A1* | 11/2015 | Liu | B29D 11/00038 |
| | | | 351/159.31 |

FOREIGN PATENT DOCUMENTS

| | | |
|---|---|---|
| TW | 201018570 A1 | 5/2010 |
| TW | 201503232 A | 1/2015 |

OTHER PUBLICATIONS

Krampouz—Professional electric waffle makers Instructions for use Gaufriers électriques AI020.8 (Year: 2012).*

Alve—Alignment Platform for Multilayer Soft Lithography (Year: 2013).*

Office Action issued in Taiwanese Patent Application No. 105103865 dated Apr. 13, 2017. English translation provided.

* cited by examiner

CONVENTIONAL EXAMPLE

IMMEDIATELY BEFORE IMPRINTING

DURING IMPRINTING

DURING MOLD RELEASING

IMMEDIATELY BEFORE IMPRINTING

DURING IMPRINTING

DURING MOLD RELEASING

MOLD, IMPRINT APPARATUS, AND METHOD OF MANUFACTURING ARTICLE

This application is a Continuation-in-Part (CIP) Application of U.S. patent application Ser. No. 14/621,822 filed Feb. 13, 2015, the entire content of which is incorporated herein by reference.

BACKGROUND OF THE INVENTION

Field of the Invention

The present invention relates to a mold, an imprint apparatus, and a method of manufacturing an article.

Description of the Related Art

An imprint technique forms a pattern by curing an imprint material by ultraviolet light or heat while pressing a mold having the pattern formed on it against a substrate applied with the imprint material. This imprint technique eliminates the need for an expensive apparatus such as a projection lens in photolithography and allows micropatterning by a simple apparatus.

In the imprint technique, if an air space remains between a mold and an imprint material on a substrate when pressing (imprinting) the mold against the imprint material, it is impossible to fill a mold pattern portion with the imprint material, thereby generating a defect in a pattern.

To prevent an air space, there is known a technique of performing imprinting by filling an imprint space with a gas such as helium which penetrates an imprint material, and applying pressure to the back surface of the mold to deform a mold pattern portion into a downwardly convex shape (US Patent Application Publication No. 2008/0160129). According to this technique, at the time of imprinting, it is possible to fill the mold pattern portion with the imprint material without leaving any air space by bringing the mold into contact with the imprint material from the central portion of the mold pattern, and moving the mold so as to expel gas outside the pattern.

When separating (releasing) the mold from the imprint material after curing the imprint material, the adhesion strength changes depending on the pattern density, and thus the mold release speed suddenly changes. This change may cause a fall of the pattern. In Japanese Patent Laid-Open No. 2010-221374, a sudden change in mold release force or mold release speed is suppressed by increasing/decreasing the amount of pressure applied to the back surface of the mold at the moment of mold releasing in accordance with the high density of the pattern.

As described above, as an imprint technique, there are provided an imprint method and a mold shape for deforming a pattern portion into a downwardly convex shape by applying pressure to the back surface of a mold at the time of imprinting and mold releasing.

When a pattern surface is deformed into a downwardly convex shape and impressed by applying pressure to the back surface of a mold, the timing at which the pattern surface is brought into contact with an imprint material is later toward the outer side of the pattern. In this case, since the contours of the downwardly convex deformed shape of the mold are circular while the pattern region has a rectangular shape, the timing at which the four corner portions farthest from the center of the pattern are brought into contact with the imprint material is particularly late. Therefore, the productivity may decrease due to a delay in a filling time, or an unfilling defect depending on the locations of the four corner positions may be generated.

When releasing the mold after curing the imprint material, the mold release force is reduced and a change in mold release speed is suppressed by applying pressure to the back surface of the mold to deform the mold into a circular convex shape, as in Japanese Patent Laid-Open No. 2010-221374. Similarly to imprinting, however, since the circular convex shape of the mold is different from the rectangular shape of the pattern region, it is impossible to maximize the effect, and it is difficult to reduce the mold release force and to control the mold release speed.

Consequently, as for the present imprinting, and the deformed shape of the mold in mold releasing, the productivity may decrease or the mold may be damaged due to a pattern defect such as unfilling or a fall of the pattern, or a delay in the filling time.

SUMMARY OF THE INVENTION

The present invention has been made in consideration of the above problems, and provides a mold, an imprint apparatus, and a method of manufacturing an article, which are advantageous in reducing a pattern defect, and improving the productivity.

According to one aspect of the present invention, there is provided a mold comprising a pattern portion in which a pattern is formed, and a concave portion formed in a back surface of the pattern portion and having a size to include the pattern portion in a planar view, wherein an edge of the pattern portion has a rectangular shape in the planar view, and the concave portion includes a sidewall portion along a side of the rectangular shape of the pattern portion.

Further features of the present invention will become apparent from the following description of exemplary embodiments (with reference to the attached drawings).

DESCRIPTION OF THE EMBODIMENTS

Preferred embodiments of the present invention will be explained in detail below with reference to the accompanying drawings. Note that the present invention is not limited to the following embodiments, and these embodiments are merely practical examples advantageous when carrying out the present invention. Note also that not all combinations of features explained in the following embodiments are essential for the present invention to solve the problem.

First Embodiment

Figure 1:
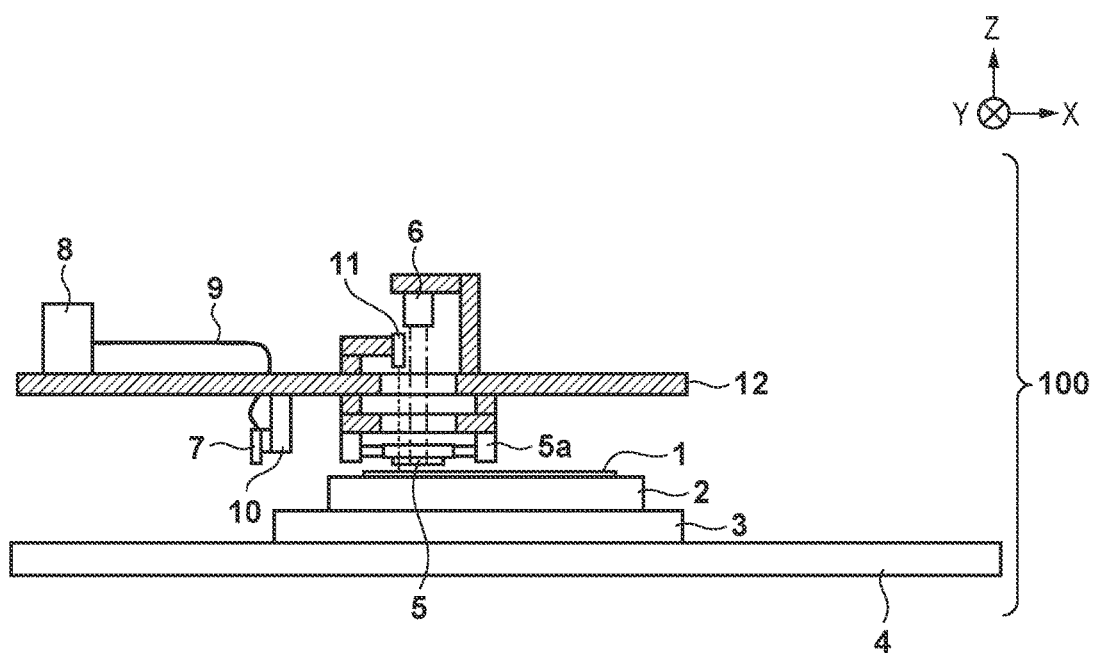
FIG. 1 is a view showing the arrangement of an imprint apparatus according to an embodiment.

An overview of an imprint apparatus according to the first embodiment will be described with reference to FIG. 1. A case in which the present invention is applied to a UV light-curing imprint apparatus which cures a resin by irradiation with UV light (ultraviolet light) will be exemplified. Note that the present invention is also applicable to an imprint apparatus which cures a resin by irradiation with light having another wavelength region, and an imprint apparatus which cures a resin using another energy (for example, heat).

An imprint apparatus 100 is configured to form a pattern in a plurality of shot regions on a substrate by repeating an imprint cycle. Note that one imprint cycle indicates a cycle in which the pattern is formed in one shot region on the substrate by curing a resin as an imprint material while a mold is pressed against the resin.

A fine-motion substrate stage 2 is a stage capable of driving a substrate 1 in the X-Y direction and the rotation direction within the X-Y plane by small amounts (for example, about 1 mm in the X-Y direction and about several degrees in the rotation direction within the X-Y plane). A coarse-motion substrate stage 3 is a stage which moves the substrate 1 in the X-Y direction by a large mount, and can move an imprint region from the loading/unloading position of the substrate 1 over the entire surface of the substrate in directions perpendicular to each other. A base frame 4 of the imprint apparatus holds the fine-motion substrate stage 2 and the coarse-motion substrate stage 3.

A three-dimensional pattern is formed on the surface of a mold 5, and transferred to the substrate 1 by inserting an imprint material (uncured resin) between the mold 5 and the substrate 1. A driving device 5a is a device for driving the mold 5 upward and downward, and performs an operation of pressing the mold 5 against the uncured resin on the substrate. An ultraviolet light generator 6 cures the resin by irradiating the uncured resin with ultraviolet light via the mold 5. The ultraviolet light generator 6 includes a light source such as a halogen lamp which generates an i-line or g-line, and a function of condensing and shaping the light emitted from the light source.

A dispenser 7 can apply a resin of a predetermined amount onto the substrate by forming small droplets of the uncured resin and discharging the droplets. The uncured resin is stored in a tank 8, and supplied to the dispenser 7 via a pipe 9. A moving device 10 moves the dispenser 7 between a discharging position and a retraction position (maintenance position). At the time of a normal discharging operation, the moving device 10 positions the dispenser 7 at the discharging position. When maintaining the dispenser 7, the moving device 10 moves the dispenser 7 to the retraction position.

An alignment scope 11 is a microscope which is used to align the pattern of the mold 5 and that of the substrate 1 after the dispenser 7 discharges and applies the uncured resin onto the substrate. The alignment scope 11 measures an overlay state between an alignment mark formed on the mold 5 and an alignment mark on the substrate, thereby aligning the mold 5 and the substrate. A platen 12 supports and fixes the above-described mold 5, driving device 5a, ultraviolet light generator 6, dispenser 7, tank 8, moving device 10, and alignment scope 11.

In general, the arrangement of the imprint apparatus 100 according to this embodiment is as described above. The operation of the imprint apparatus 100 will be explained with reference to FIGS. 2A-2D and 3A-3C.

Figure 2A:
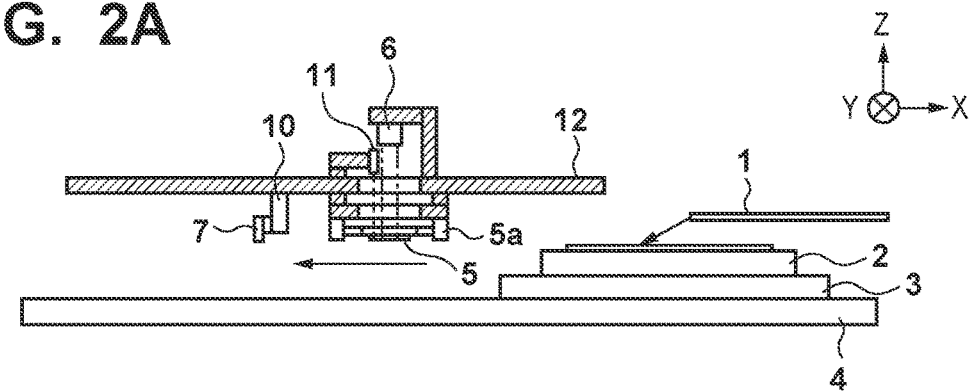
FIGS. 2A-2D and 3A-3C are views for explaining an imprint sequence.
Figure 2B:
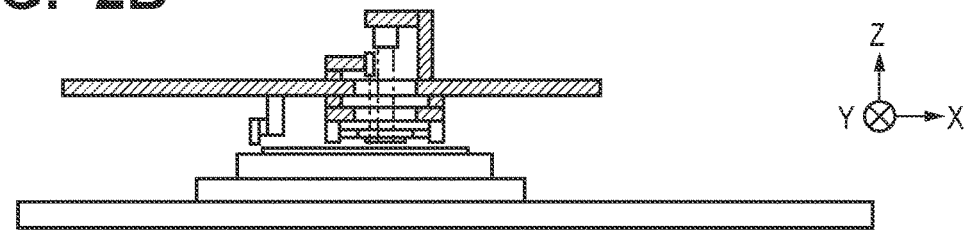
Figure 2C:
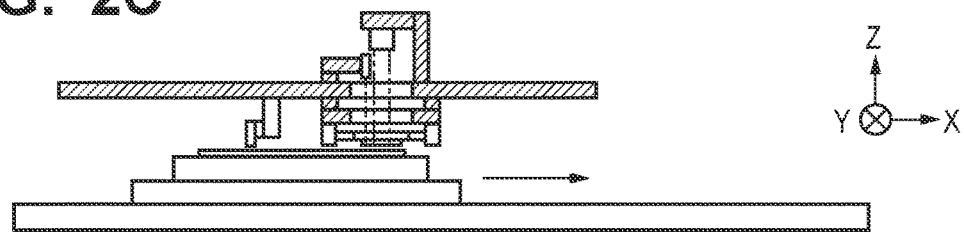
Figure 2D:
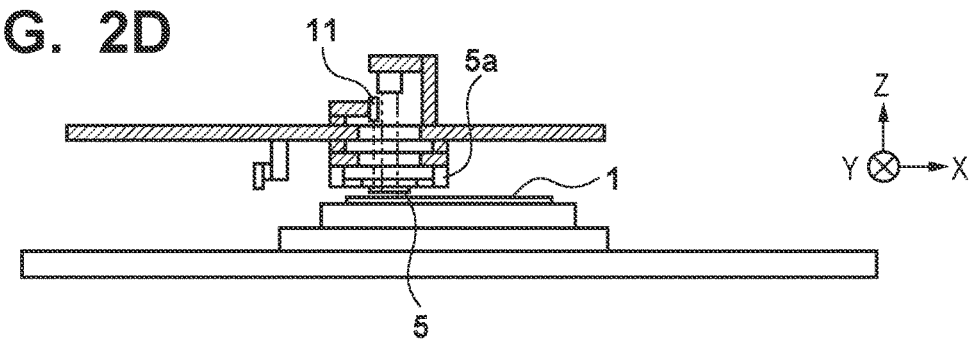

In FIG. 2A, the substrate 1 is mounted on the fine-motion substrate stage 2 and the coarse-motion substrate stage 3. In FIG. 2B, the fine-motion substrate stage 2 and the coarse-motion substrate stage 3 align the substrate 1 by moving it below the dispenser 7. In FIG. 2C, the dispenser 7 applies a resin of a predetermined amount onto the substrate. In FIG. 2D, the alignment scope 11 overlays the alignment mark of the mold 5 on the alignment mark of the substrate 1 using the fine-motion substrate stage 2, thereby adjusting the relative positions of the mold 5 and the substrate 1.

Figure 3A:
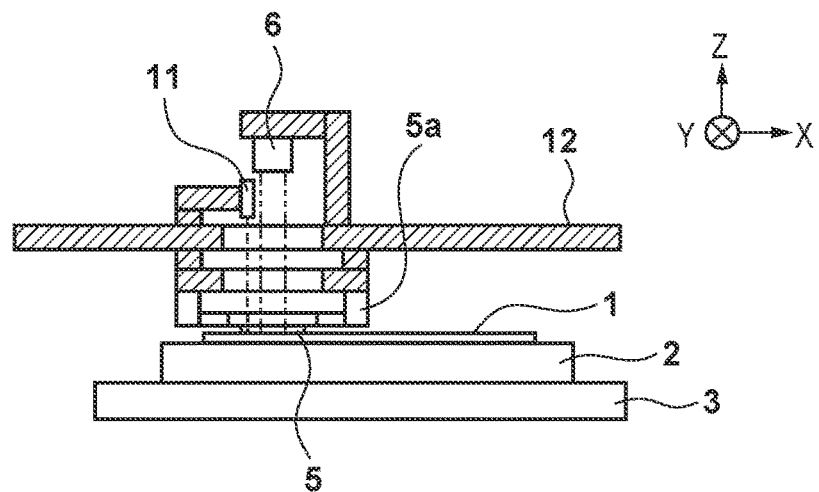
Figure 3B:
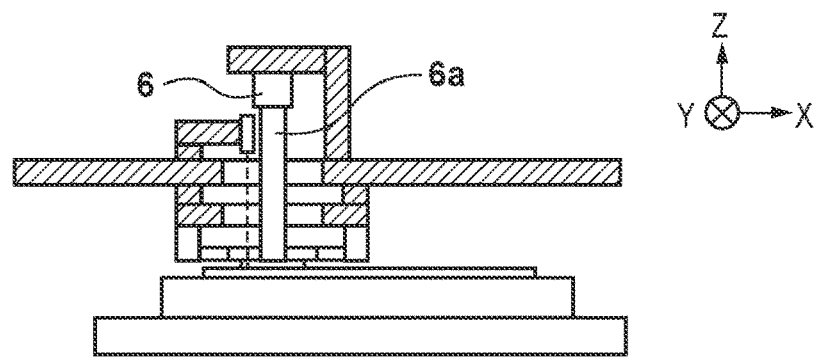
Figure 3C:
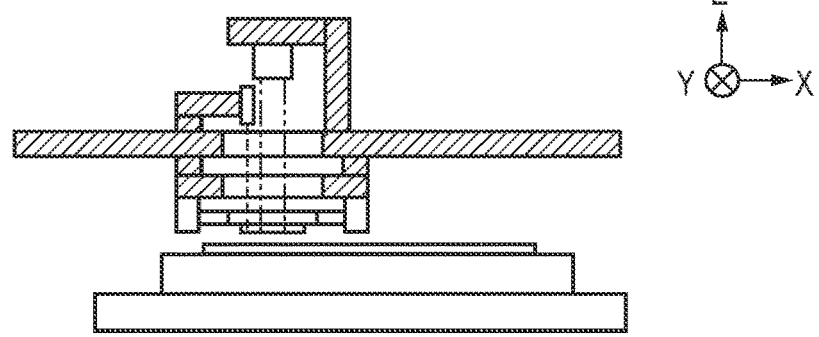

In FIG. 3A, the driving device 5a moves the mold 5 in the downward direction toward the substrate 1, and pressing the pattern portion of the mold 5 against the uncured resin on the substrate 1, thereby transferring the pattern. In FIG. 3B, the ultraviolet light generator 6 performs irradiation with ultraviolet light 6a from above. The uncured resin is irradiated with the ultraviolet light 6a having passed through the mold 5. At this stage, the uncured resin is cured. In FIG. 3C, a patterned resin layer is formed on the substrate 1 by separating (releasing) the mold upward, and the imprint operation is terminated.

Figure 4:
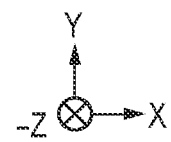
FIG. 4 is a view for explaining an imprint order on a wafer.
Figure 4:
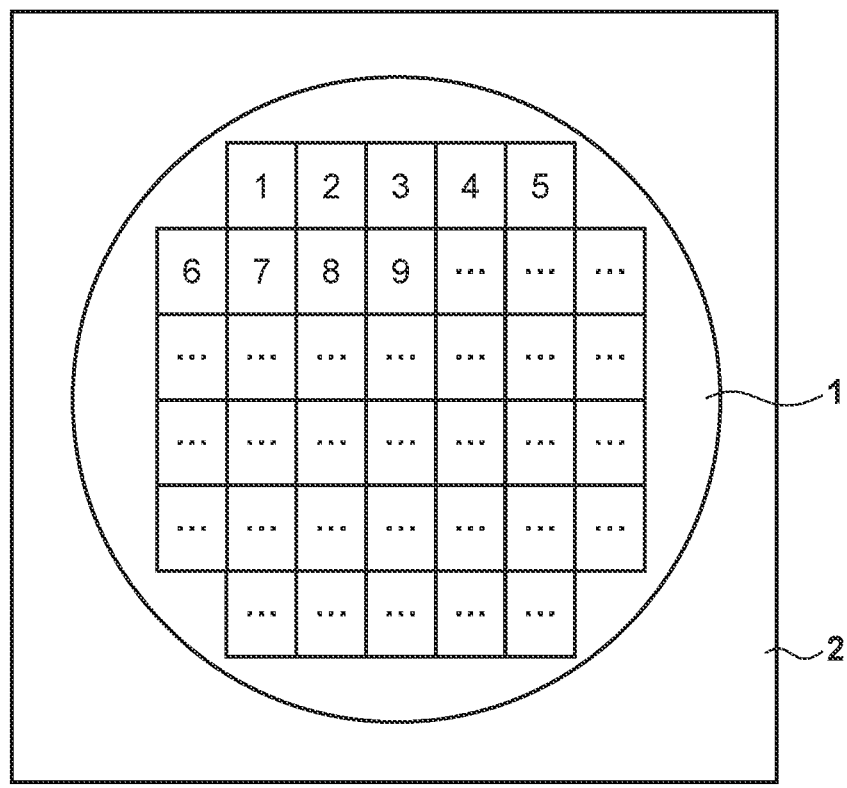

An imprint apparatus which imprints the pattern of a mold on a substrate a plurality of times repeats the imprint operation including the above steps for the substrate 1 in the order of continuous shot Nos. 1, 2, 3, . . . , as shown in FIG. 4.

An arrangement around the mold and an operation at the time of imprinting will be described with reference to FIGS. 5A-5B, 6A-6B, 7A-7D, and 8A-8B.

Figure 5A:
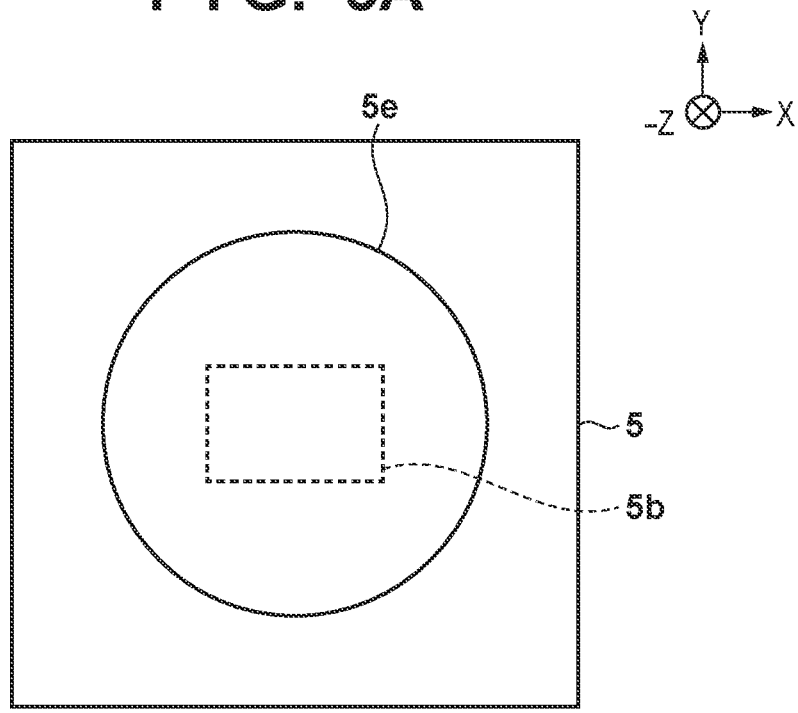
FIGS. 5A-5B are views for explaining the arrangement of an imprint apparatus according to the first embodiment.
Figure 5B:
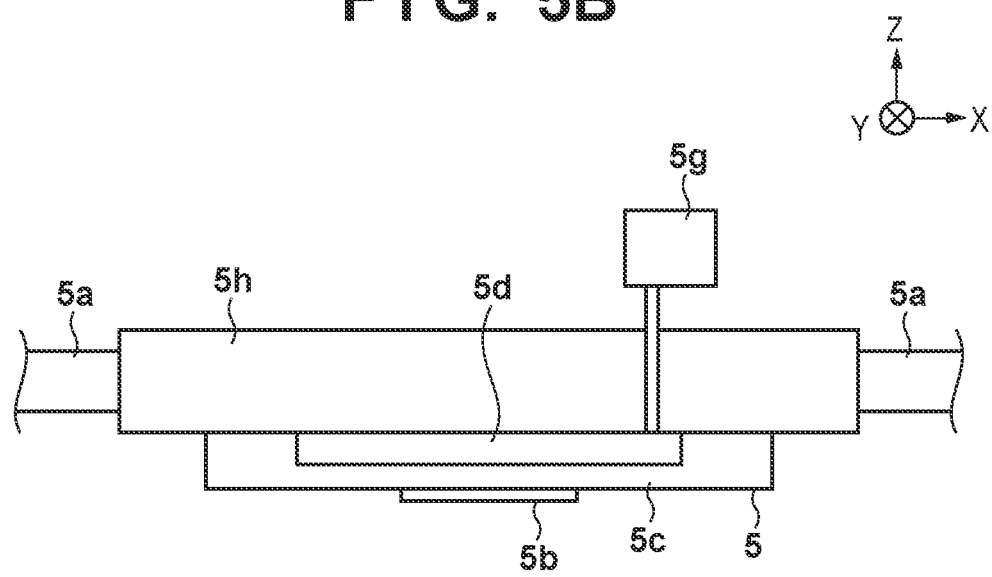

FIG. 5A is a view showing the back surface of the mold 5, and FIG. 5B is a sectional view showing the mold 5 and its periphery. The mold 5 is, for example, a 6-inch reticle (152 mm long×152 mm wide×6.35 mm thick, material: quartz). Although the 6-inch reticle is exemplified here, the present invention is not limited to a specific size or material. The back surface of the mold 5 is chucked and held by a mold chuck 5h by vacuum suction, Bernoulli suction, or the like. The mold 5 has a concave portion 5e recessed into a predetermined shape by processing the back surface. This forms a thin portion 5c which remains by processing the back surface. The concave portion 5e has a size to include a pattern portion 5b. The pattern portion 5b is positioned at the center of the surface of the mold 5 and at the center of the thin portion 5c in a planar view.

The mold 5 forms a closed space 5d when it is chucked by the mold chuck 5h. A pressurization/depressurization mechanism 5g is connected to the closed space 5d via a pipe, and can control the closed space 5d at desired pressure. The pressure to be controlled is, for example, a gauge pressure of −30 kPa to 30 kPa, and can be freely set within the range of the chucking force of the mold according to the deformation amount of the mold to be deformed and the high density of the pattern, thereby selecting a pressurization/depressurization mechanism. A pressure sensor is arranged within the pressurization/depressurization mechanism 5g to control the pressure, but may be arranged within the closed space 5d so as to control the pressure at higher accuracy.

Figure 6A:
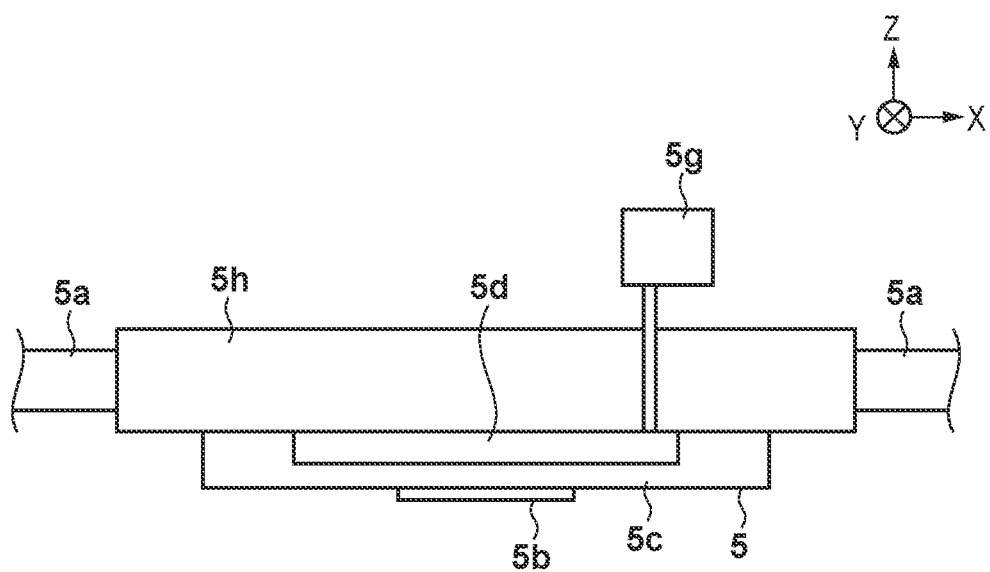
FIGS. 6A-6B are views for explaining the arrangement of the imprint apparatus according to the first embodiment.
Figure 6B:
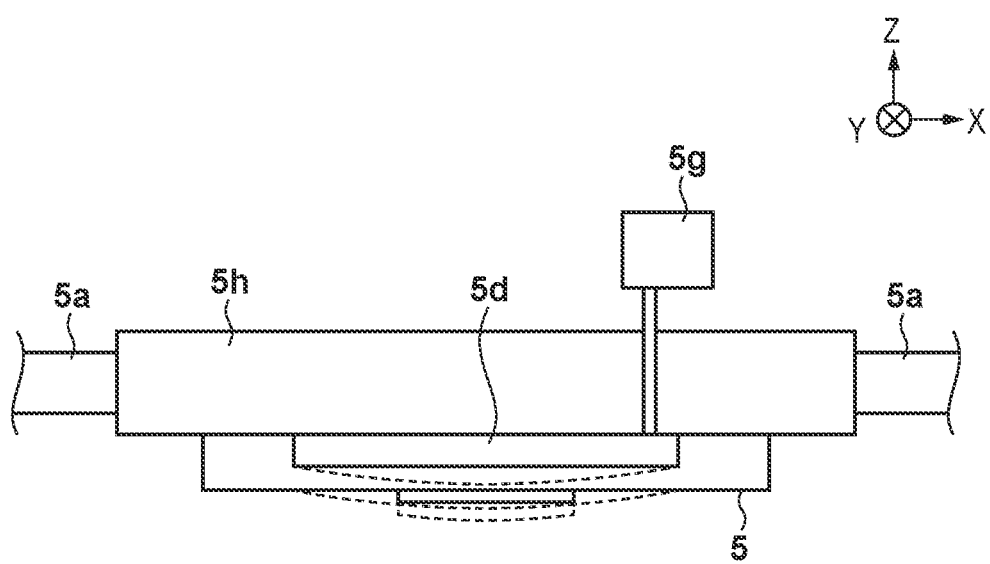

FIGS. 6A-6B show a case in which the mold 5 is deformed by applying pressure to the closed space 5d. When pressure is applied to the closed space 5d in a state shown in FIG. 6A, the mold 5 is deformed in a direction so as to increase the volume, as shown in FIG. 6B, and thus the thin portion 5c and the pattern portion 5b are deformed into a downwardly convex shape.

Figure 7A:
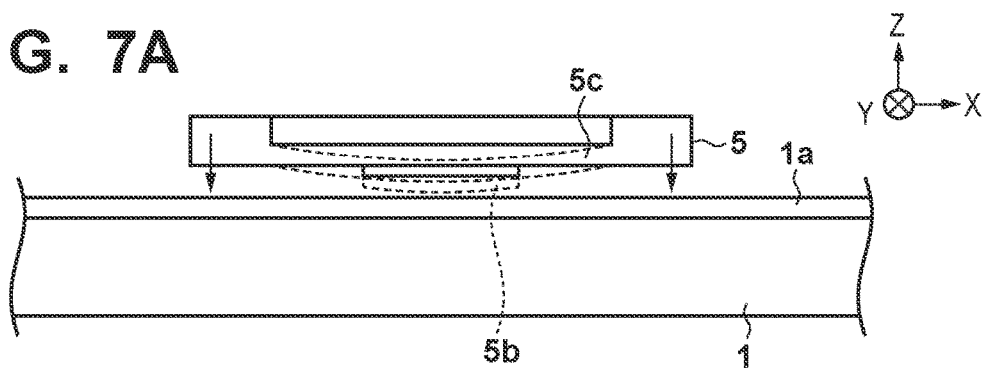
FIGS. 7A-7D are views for explaining an operation at the time of imprinting.

An operation at the time of imprinting will be explained with reference to FIGS. 7A-7D. FIG. 7A shows a case in which the driving device 5a moves the mold downward to perform an imprint operation while the mold is deformed into a downwardly convex shape after the imprint material is applied onto the substrate in the step shown in FIG. 2B. The imprint operation first brings the pattern portion 5b into contact with an imprint material 1a on the substrate 1. After that, the contact portion extends outward, and the imprint material 1a is in contact with the entire region of the pattern portion 5b, thereby performing filling.

Figure 7B:
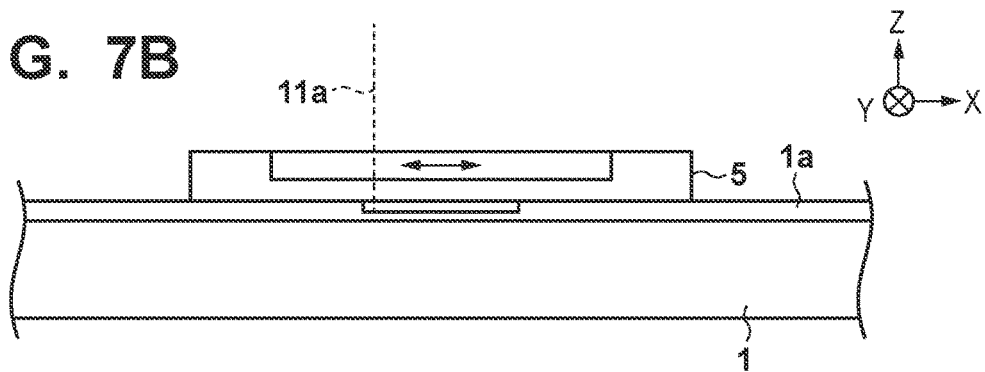

FIG. 7B shows an alignment operation performed before the imprint material is cured by ultraviolet light while the substrate 1 is in contact with the imprint material. More specifically, the alignment scope 11 adjusts the fine-motion substrate stage 2 so that the alignment mark of the mold 5 is overlaid on the alignment mark of the substrate 1.

Figure 7C:
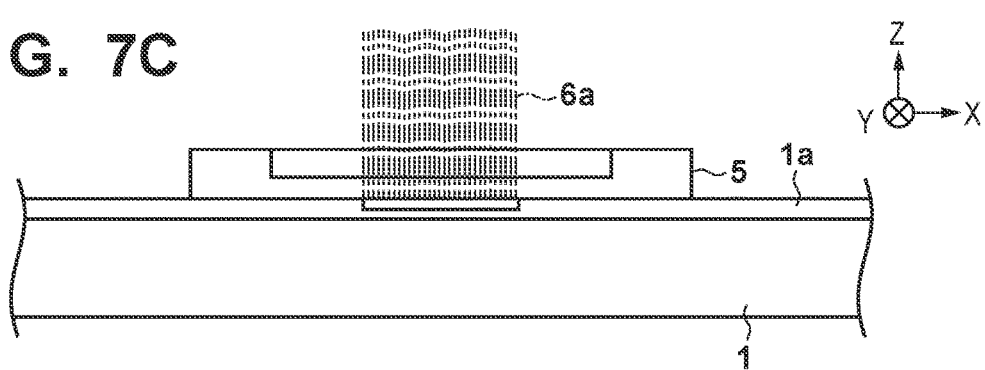

FIG. 7C shows an operation of performing irradiation with the ultraviolet light 6a from above by the ultraviolet light generator 6. The uncured resin is irradiated with the ultraviolet light 6a having passed through the mold 5. At this stage, the uncured resin is cured.

Figure 7D:
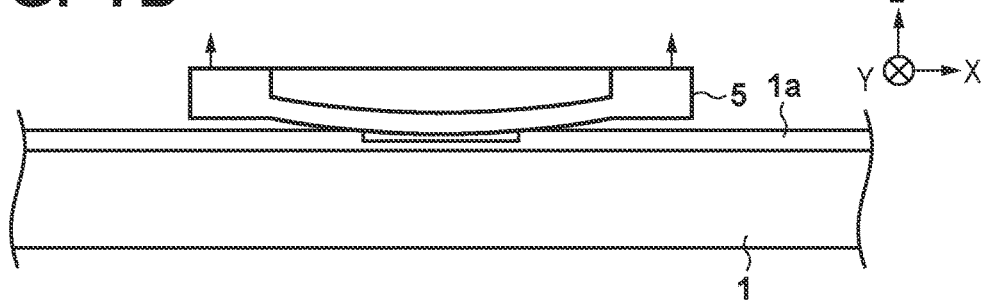

FIG. 7D shows an operation of separating and retracting (releasing) the mold 5 upward. In this operation, the mold starts to be separated from the imprint material from the outer side of the pattern. At this moment, the pressure of the closed space 5d is adjusted. This changes the downwardly convex deformed shape of the mold, and it is thus possible to control the speed at which separation advances, a region where separation advances, and an increase/decrease in mold release force along with separation. When the mold is completely separated and retracted, the imprint operation is terminated.

Figure 8A:
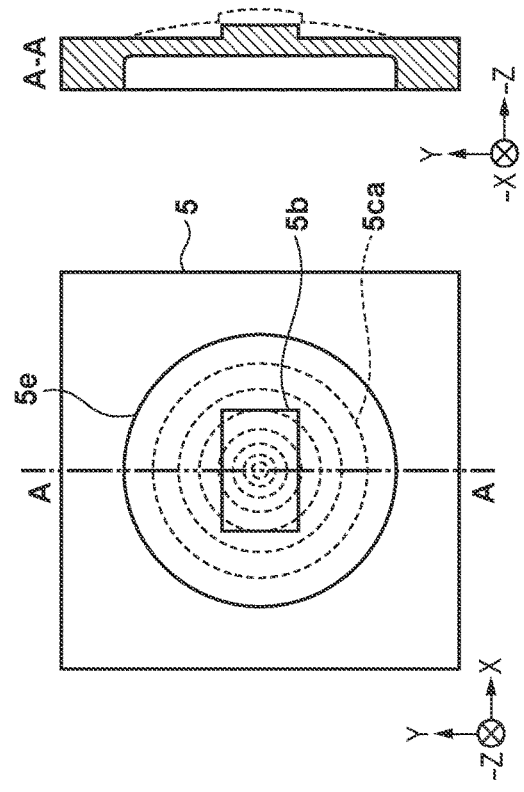
FIGS. 8A-8B are views for explaining a mold shape according to the first embodiment.
Figure 8B:
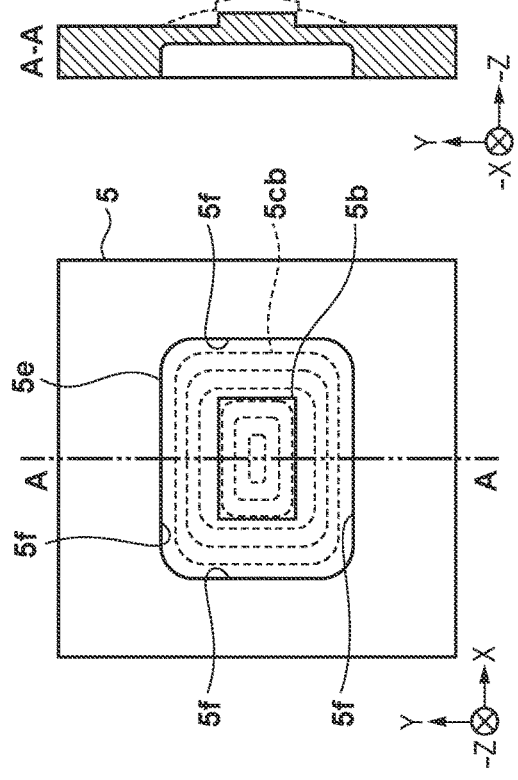

FIGS. 8A-8B show examples of a plan view, sectional view, and perspective view each showing a mold. FIG. 8A shows a mold according to a conventional example, and FIG. 8B shows a mold according to this embodiment. Broken lines 5ca or 5cb indicate contours which express a deformed shape when the concave portion 5e is deformed by applying pressure. Each sectional view taken along a line A-A shows the downwardly convex deformed shape by a broken line. The pattern portion 5b generally has a rectangular shape in a planar view. To the contrary, as shown in FIG. 8A, in the mold according to the conventional example, the concave portion 5e has a circular shape in a planar view. Therefore, the shape at the time of application of pressure is a shape which draws contours in a circular shape. In the region of the pattern portion 5b, the displacement amount in the +Z direction in the four corner portions is smallest.

On the other hand, in the mold according to this embodiment, as shown in FIG. 8B, the concave portion 5e has sidewall portions 5f along the respective sides of the rectangular shape of the pattern portion 5b. Therefore, the edge of the concave portion 5e has a rectangular shape similar to the shape of the pattern portion 5b. The sidewall portions may be formed so that the edge of the concave portion 5e has an almost rectangular shape with four rounded corners. In this case, if the centers of the four rounded corners of the concave portion 5e are set as the corners of the pattern portion 5b, the shortest distance from each point on the entire edge of the pattern portion 5b to the sidewall portion of the concave portion 5e can be set constant. The deformation amounts of the concave portion 5e at respective points in the periphery of the pattern portion 5b are equal to each other. The shape at the time of application of pressure becomes a shape which draws contours in a rectangular shape. This can uniform the deformation amounts in the +Z direction of the four corner portions of the region of the pattern portion 5b in the periphery of the pattern. In this embodiment, processing for forming the concave portion 5e (the thin portion) of the mold is performed by grinding using a hard grinding tool such as a diamond, or by sandblasting that involves spraying an abrasive material. The same processing can be carried out for the concave portion in the following embodiments.

Second Embodiment

The second embodiment will be described next. The arrangement of an imprint apparatus and an imprint operation are the same as in the first embodiment (FIGS. 1 to 8B).

Figure 9:
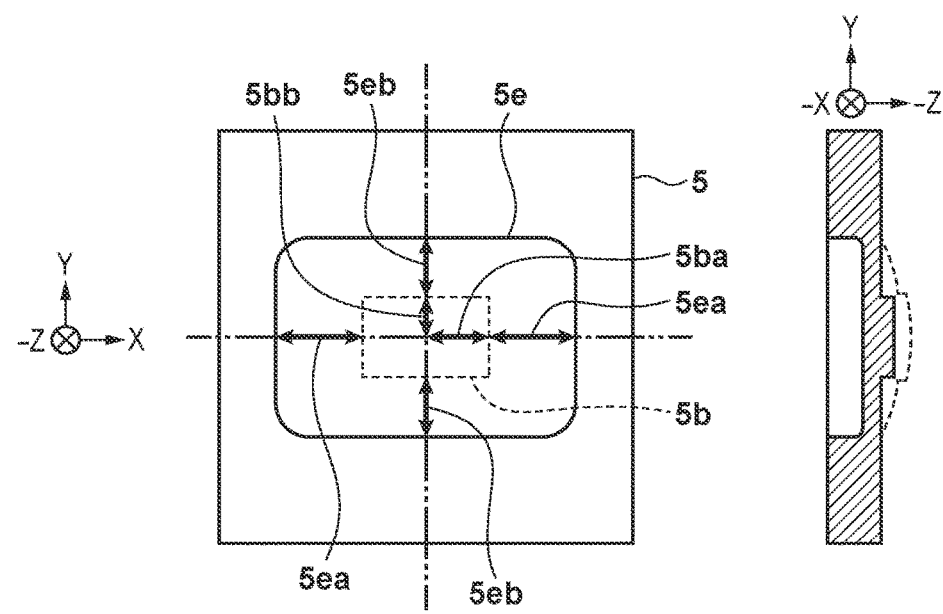
FIG. 9 is a view for explaining a mold shape according to the second embodiment.
Figure 9:
Figure 9:
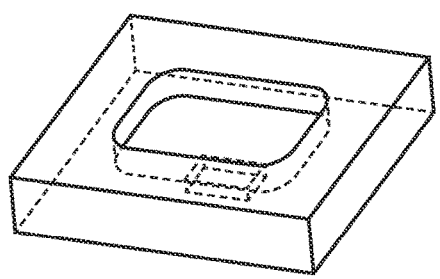

FIG. 9 shows a plan view, sectional view, and perspective view each showing a mold according to the second embodiment. The lengths from the center of a pattern portion 5b to its edge in the X and Y directions are represented by 5ba and 5bb, respectively. The lengths from the edge of the pattern portion 5b to the edge of a concave portion 5e in the X and Y directions are represented by 5ea and 5eb, respectively. If the length 5ba in the X direction of the pattern portion 5b is different from the length 5bb in the Y direction of the pattern portion 5b, the lengths 5ea and 5eb of the concave portion 5e are set to be proportional to the lengths of the pattern portion. This can set the contour intervals of the shape at the time of application of pressure to be proportional to the vertical and horizontal lengths of the pattern, thereby suppressing the difference between a vertical contour difference and a horizontal contour difference in the periphery of the pattern. More strictly, a shape in which the deformation amounts in the +Z direction at the four corners of the pattern portion are equal to each other in the periphery of the pattern can be formed.

Third Embodiment

The third embodiment will be described next. The arrangement of an imprint apparatus and an imprint operation are the same as in the first embodiment (FIGS. 1 to 8B).

Figure 10:
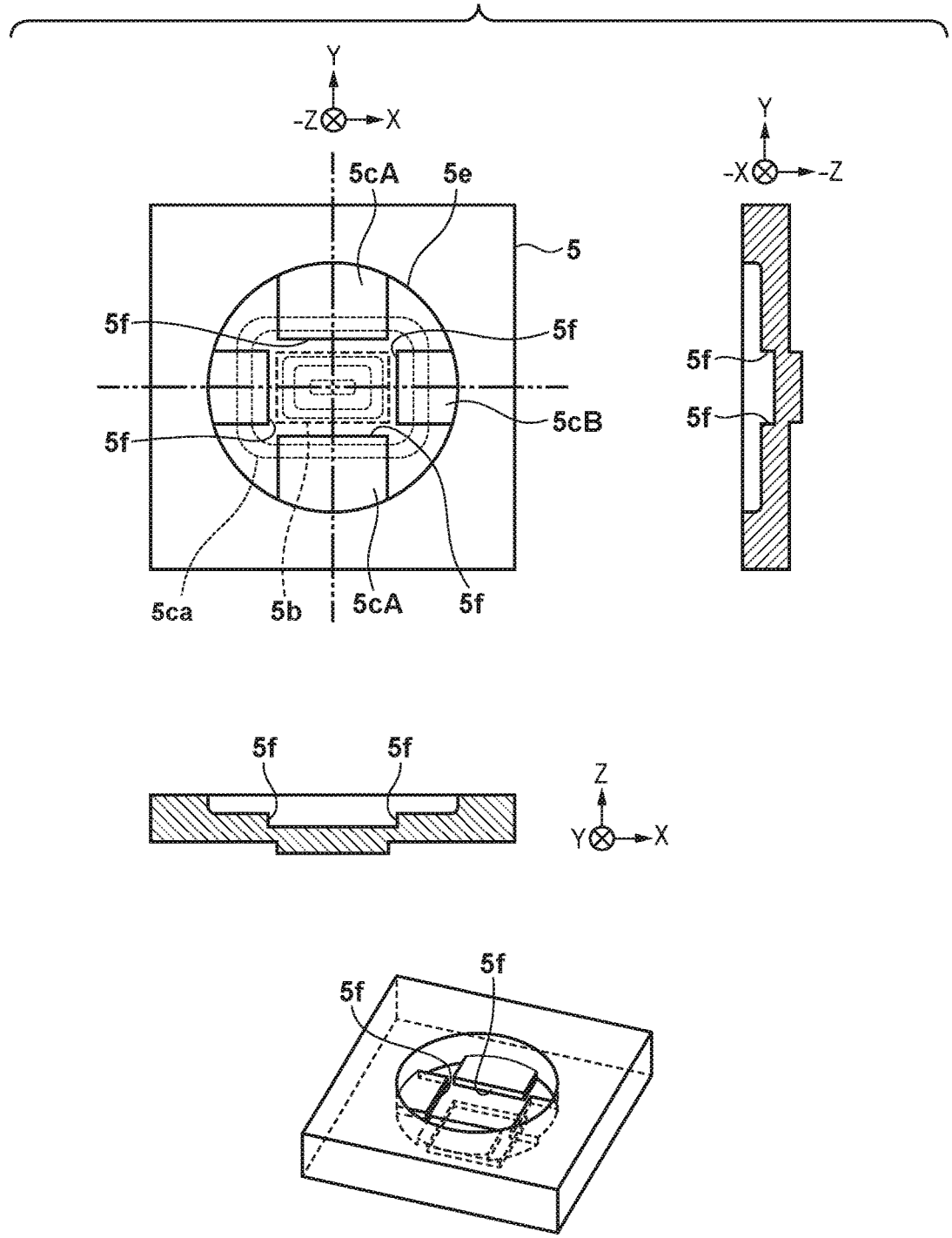
FIG. 10 is a view for explaining a mold shape according to the third embodiment.

FIG. 10 shows a plan view, sectional view, and perspective view each showing a mold according to the third embodiment. The shape of a concave portion 5e in a planar view is, for example, a circular shape. The shape of the concave portion 5e in the planar view may be a rectangular shape. First rigid portions 5cA and 5cB each having a thickness are formed as sidewall portions 5f along the respective sides of the rectangular shape of a pattern portion 5b outside the pattern portion 5b within the concave portion 5e. The first rigid portions 5cA and 5cB may have different thicknesses. By making the four side portions of the pattern portion 5b have strength by the first rigid portions 5cA and 5cB, the side portions are difficult to deform at the time of application of pressure, as compared with the four corner portions and pattern portion. The shape at the time of application of pressure is thus a rectangular shape as indicated by contours 5ca. Instead of forming the rigid portions 5cA and 5cB, the shape may be formed so that only the thicknesses of the four corner portions are small. Deformation into the rectangular shape at the time of application of pressure becomes possible by making the thicknesses of the four sides different from those of the four corner portions.

Fourth Embodiment

The fourth embodiment will be described next. The arrangement of an imprint apparatus and an imprint operation are the same as in the first embodiment (FIGS. 1 to 8B).

Figure 11:
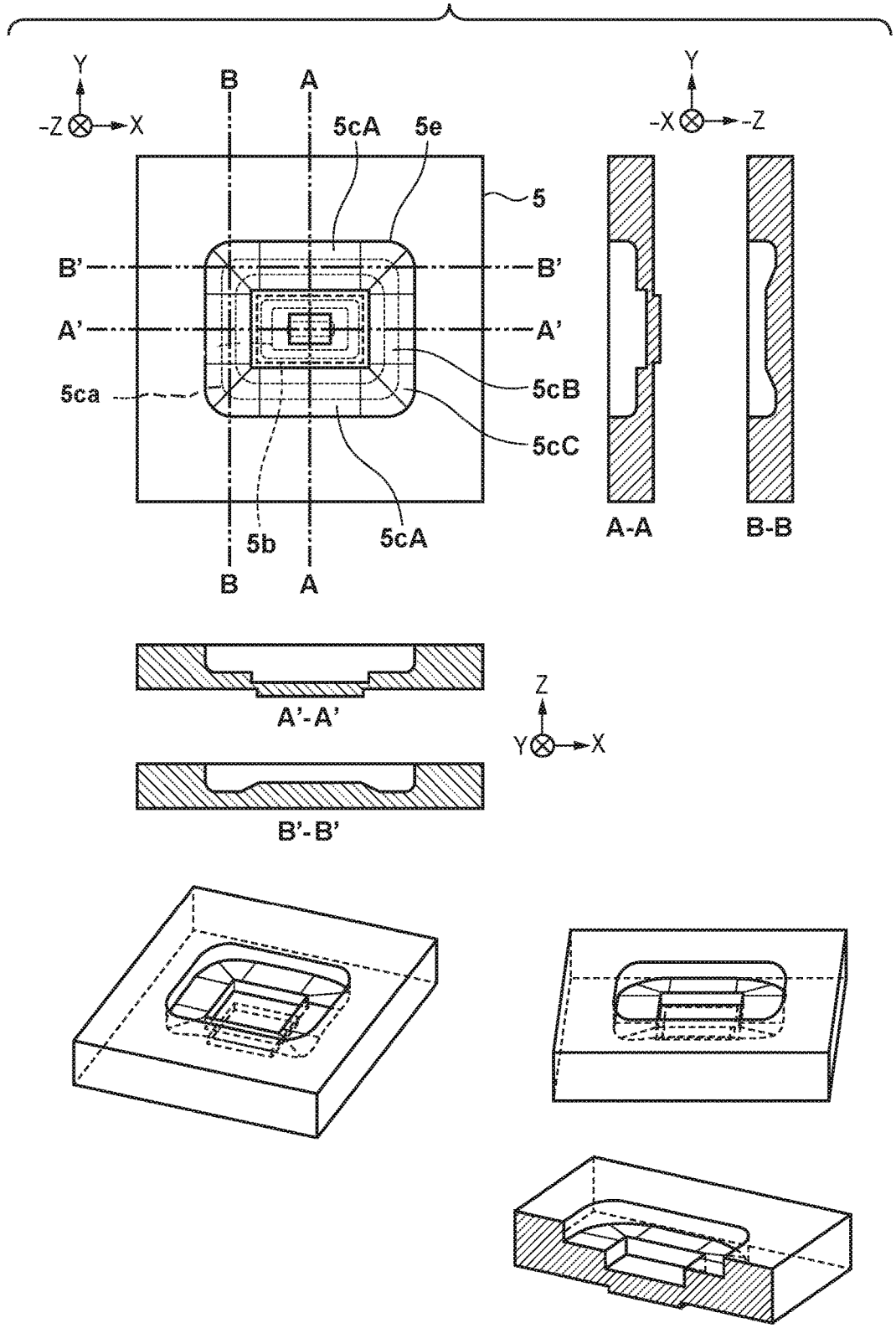
FIG. 11 is a view for explaining a mold shape according to the fourth embodiment.

FIG. 11 shows a plan view, sectional view, and perspective view each showing a mold according to the fourth embodiment. In FIG. 11, the opening of a concave portion 5e has an almost rectangular shape. Note that the opening may have a circular shape or another geometrical shape. As in the third embodiment, first rigid portions 5cA and 5cB each having a thickness are formed along respective sides outside a pattern portion 5b within the concave portion 5e. Second rigid portions 5cC may also be formed outside the four corners of the pattern portion 5b. The upper surface of each second rigid portion 5cC is inclined so that the height of the portion becomes lower toward the corner of the concave portion, as shown in a sectional view taken along a line B-B and a sectional view taken along a line B'-B'. That is, each second rigid portion 5cC has lower rigidity toward the corner of the concave portion. This can more accurately form the shape at the time of application of pressure into a rectangular shape like contours 5ca. It is thus possible to more accurately deform the shape into a rectangular shape by gradually changing the thicknesses of the four corner portions.

Fifth Embodiment

The fifth embodiment will be described next. The apparatus of an imprint apparatus and an imprint operation are the same as in the first embodiment (FIGS. 1 to 8B).

Figure 12:
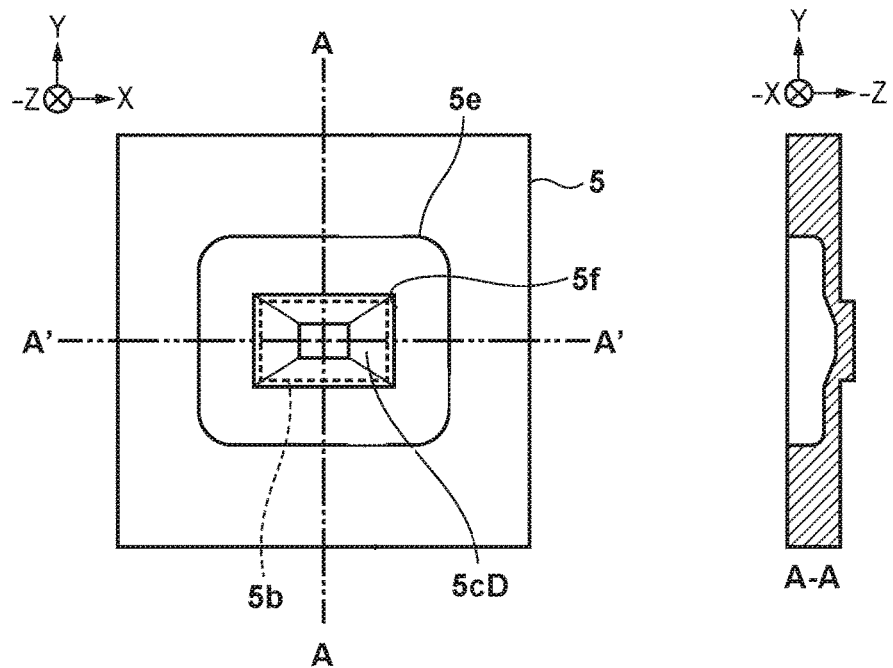
FIG. 12 is a view for explaining a mold shape according to the fifth embodiment.
Figure 12:
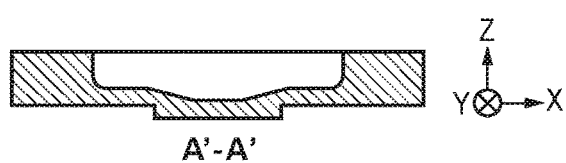
Figure 12:
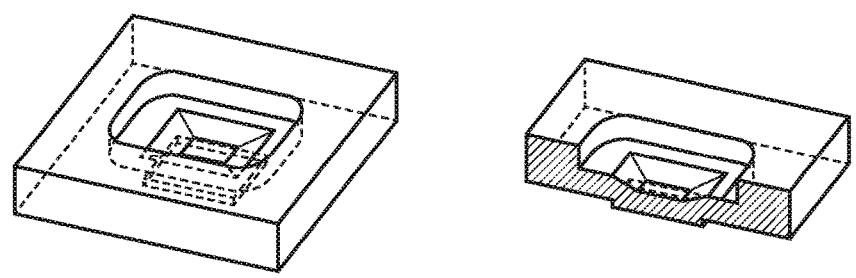

FIG. 12 shows a plan view, sectional view, and perspective view each showing a mold according to the fifth embodiment. In FIG. 12, the opening of a concave portion 5e has an almost rectangular shape. Note that the opening may have a circular shape or another geometrical shape. In FIG. 12, the bottom portion of the concave portion 5e includes an inclined portion 5cD whose height becomes lower toward the center of a pattern portion 5b. That is, the bottom portion of the concave portion 5e is formed by the inclined portion 5cD so as to have a smaller thickness toward the pattern portion 5b. The contours expressing a change in thickness have a rectangular shape. This can form the deformed shape of the pattern portion at the time of application of pressure into a rectangular shape.

Figure 13A:
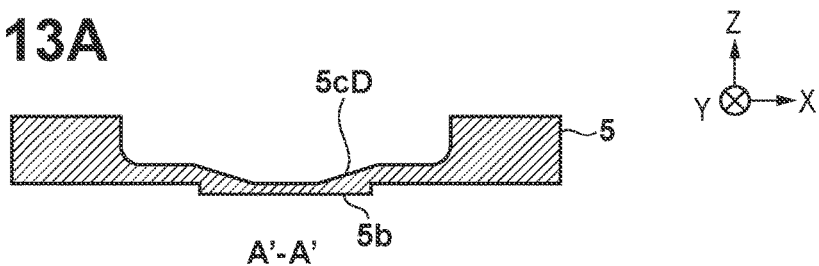
FIGS. 13A-13C are views for explaining mold deformation during imprinting according to the fifth embodiment.
Figure 13B:
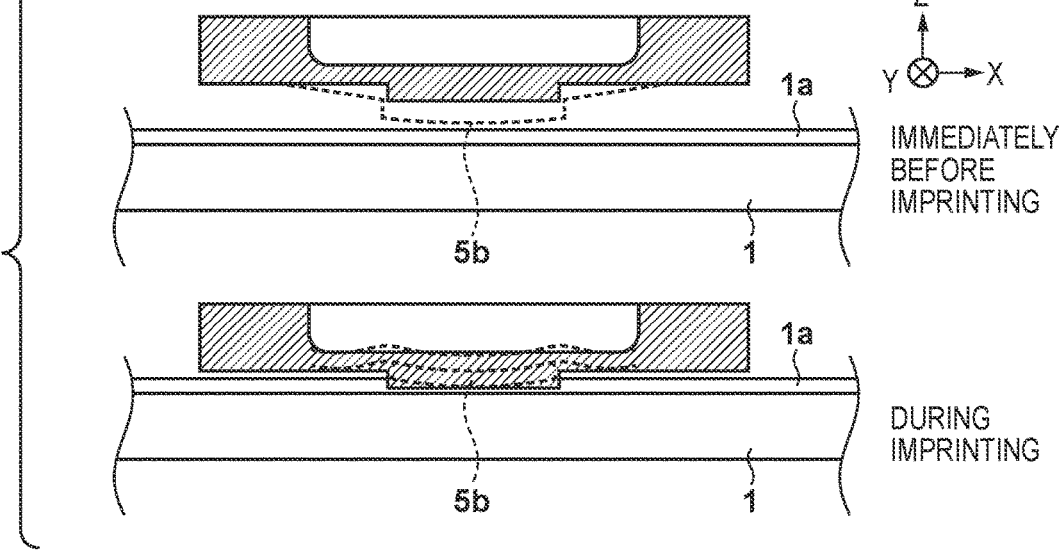
Figure 13C:
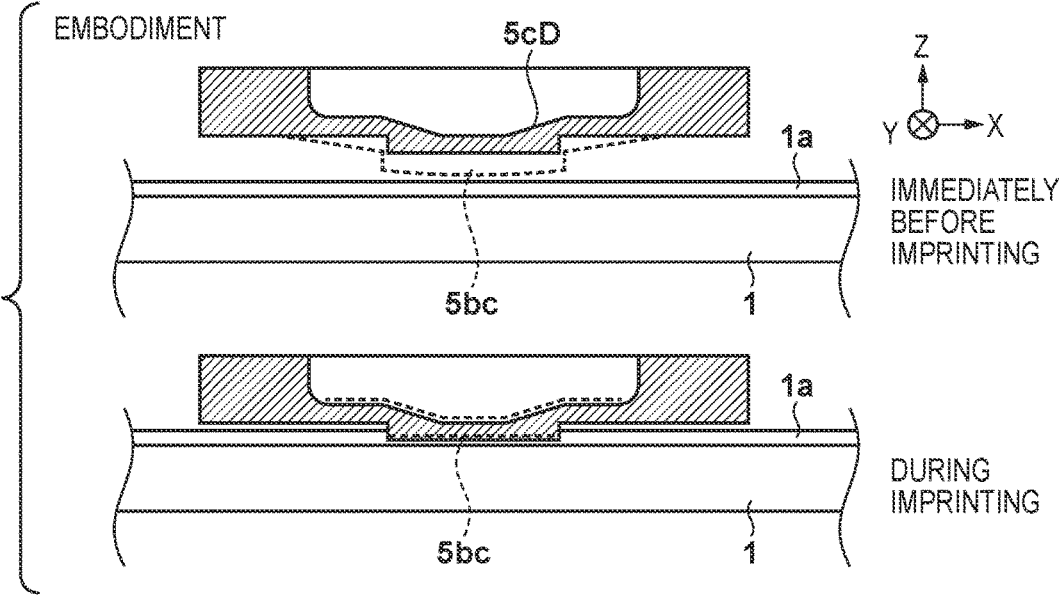

It is also possible to obtain the effect of suppressing deformation of the pattern portion caused by a reaction force from an imprint material at the time of an imprint operation. This will be described with reference to FIGS. 13A-13C. FIGS. 13A-13C show deformation of the pattern portion 5b at the time of imprinting. FIG. 13A shows the state of a mold 5 before imprinting according to this embodiment. In this embodiment, as described above, the inclined portion 5cD which inclines toward the center of the pattern portion is included.

FIG. 13B shows a conventional example. In the conventional example, there is no inclined portion unlike in FIG. 13A. In the conventional example, the pattern portion 5b is deformed into a downwardly convex shape by applying pressure to the back surface of the mold immediately before imprinting. During imprinting, the pattern portion 5b is deformed by a reaction force from an imprint material. At this time, a portion with lower rigidity in the pattern portion 5b and the thin portion around the pattern portion is largely deformed. In the conventional example, since the rigidity of the thin portion is lowest, the peripheral region of the pattern portion, which is close to the thin portion, is largely deformed. Since variations in deformation in the Z direction occur within the pattern region, thickness variations occur within the pattern in the cured imprint material after imprinting. The thickness variations in the imprint material may result in a residual error after etching in the post-process of a wafer, thereby causing a pattern defect.

To the contrary, in this embodiment, as shown in FIG. 13C, the inclined portion 5cD decreases the rigidity of the central region of the pattern portion, thereby decreasing the difference between the rigidity of the central region and that of the periphery of the pattern. This uniforms deformation within the pattern caused by a reaction force at the time of imprinting, and it is thus possible to reduce variations in deformation in the Z direction within the pattern.

As described above, with the shape of the mold shown in FIG. 12, it is possible to deform the pattern portion into a rectangular convex shape at the time of application of pressure, and to reduce variations in deformation within the pattern caused by a reaction force from the imprint material at the time of imprinting.

Sixth Embodiment

The sixth embodiment will be described. The arrangement of an imprint apparatus and an imprint operation are the same as in the first embodiment (FIGS. 1 to 8B).

Figure 14:
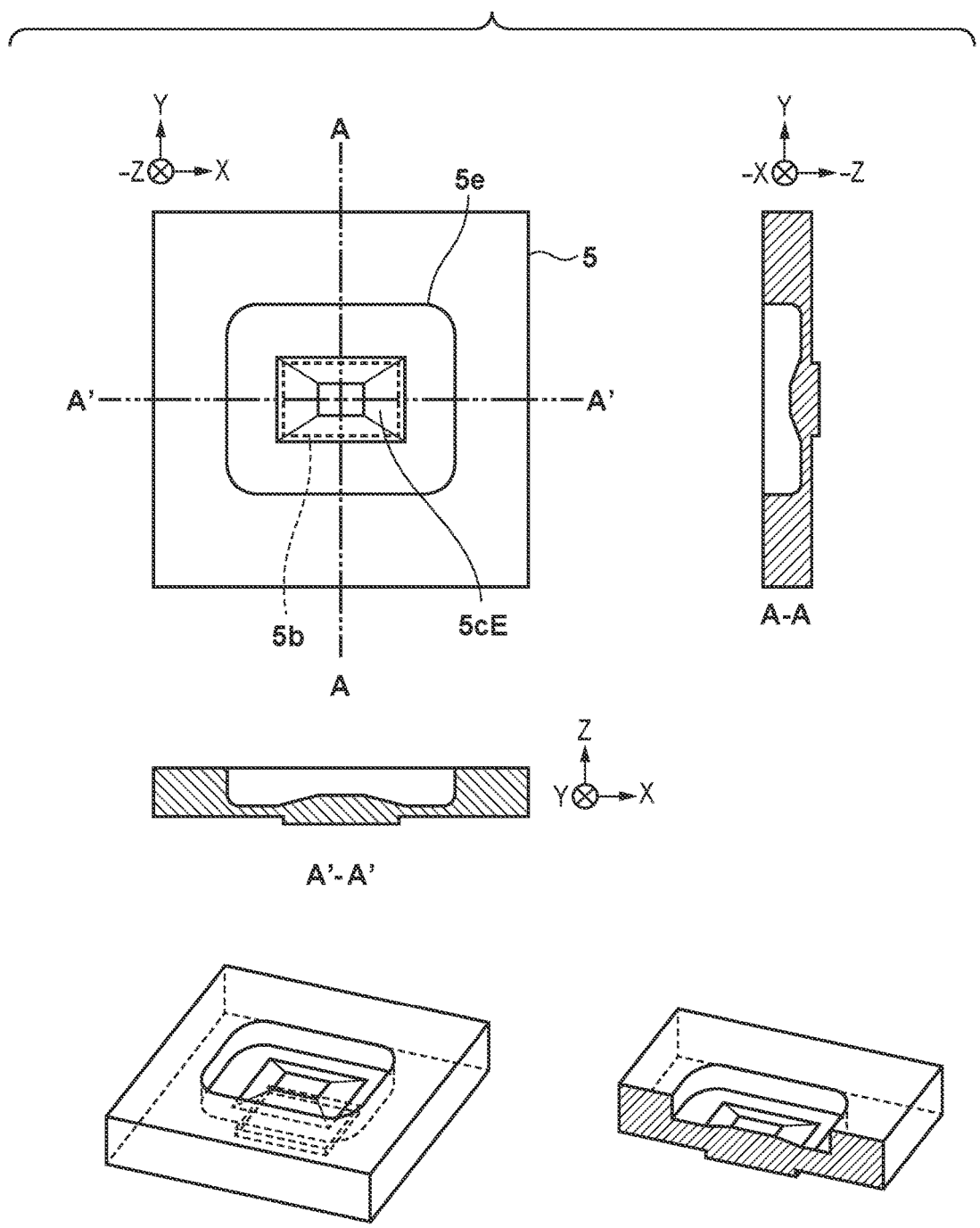
FIG. 14 is a view for explaining a mold shape according to the sixth embodiment.

FIG. 14 shows a plan view, sectional view, and perspective view each showing a mold according to the sixth embodiment. In FIG. 14, the opening of a concave portion 5e has an almost rectangular shape. Note that the opening may have a circular shape or another geometrical shape. In FIG. 14, the bottom portion of the concave portion 5e includes an inclined portion 5cE whose height becomes higher toward the central portion of a pattern portion 5b. That is, the bottom portion of the concave portion 5e is formed by the inclined portion 5cE to have a thickness larger in the central portion of the pattern portion than in a thin portion outside the pattern portion. Note that the inclination of the inclined portion 5cE need only be linear or thicker than the thin portion outside the pattern portion by a combination of curves or the like. By increasing the thickness toward the central portion of the pattern region, it is possible to reduce deformation of the central portion of the pattern region caused by a reaction force from an imprint material at the time of imprinting and mold releasing. It is necessary to wet the mold with the imprint material from the center of the mold by applying pressure to the mold and deforming the mold into a downwardly convex shape before imprinting, and it is also necessary to suppress the deformation distortion at the time of imprinting and mold releasing. Therefore, it is possible to implement both the above requirements by increasing only the thickness of the central region of the pattern portion while keeping the thickness of the thin portion outside the pattern portion small.

Figure 15:
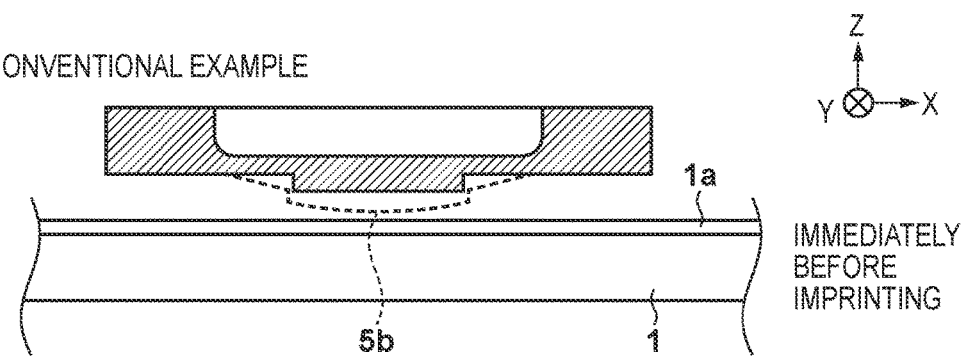
FIG. 15 is a view for explaining mold deformation during imprinting according to a conventional example.
Figure 15:
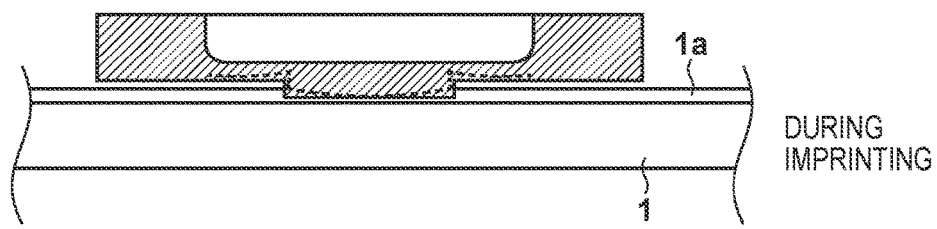
Figure 15:
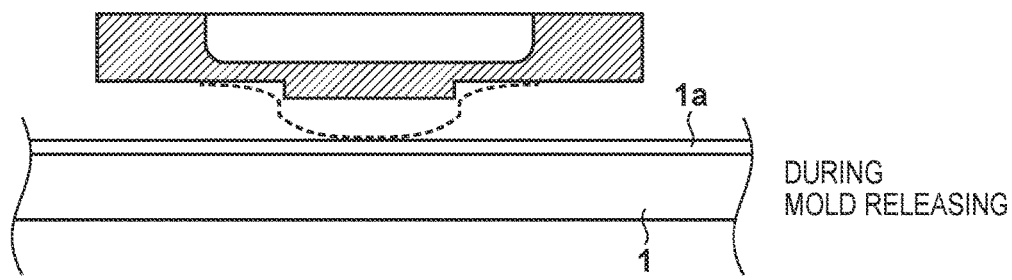

FIG. 15 shows an example of mold deformation at the time of imprinting and releasing of the conventional mold. Pressure is applied to the back surface of the mold to deform the pattern portion 5b in a downwardly convex shape immediately before imprinting, and the mold is wet with the imprint material on the wafer from the central portion of the pattern portion so as to expel gas. After that, the pattern portion is deformed into a downwardly convex shape during mold releasing, and the mold is released from the outer side of the pattern portion. If deformation of the pattern portion is larger than necessary, a defect such as a fall of the pattern occurs. Therefore, it is necessary to reduce mold deformation in the pattern portion. Furthermore, if deformation is large, deformation of the central portion of the mold is large, and the mold pattern in the central portion of the mold may be damaged.

Figure 16:
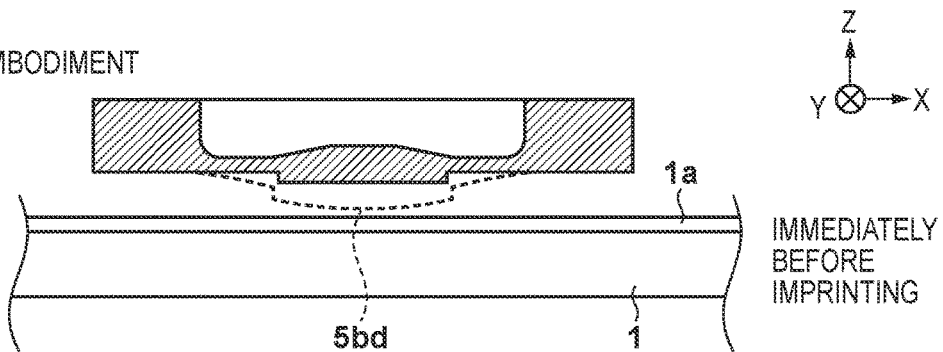
FIG. 16 is a view for explaining mold deformation during imprinting according to the sixth embodiment.
Figure 16:
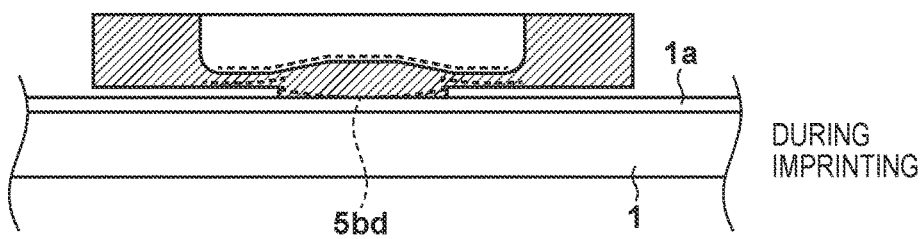
Figure 16:
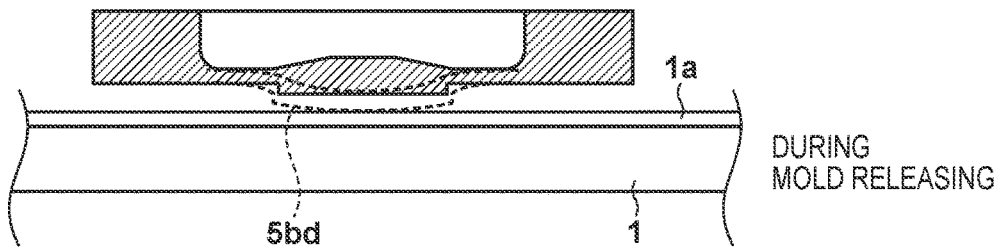

FIG. 16 shows deformation of the mold at the time of imprinting and mold releasing according to this embodiment. Immediately before imprinting, pressure is applied to the back surface of the mold to deform the pattern portion 5b into a downwardly convex shape. At this time, since the pattern region is thicker than that in the conventional example, it is possible to reduce a delay in filling of the four corner portions of the pattern by suppressing the deformation amount to a minimum to expel gas at the time of imprinting, and making the pattern portion have a shape close to a flat shape as much as possible. During mold releasing, since the rigidity of the pattern portion is high, it is possible to suppress deformation of the pattern portion, as compared with the conventional example, and to reduce a defect such as a fall of the pattern. Furthermore, since the deformation amount at the time of releasing the central portion of the mold can be suppressed, damage to the central portion of the mold can also be suppressed. As described above, in this embodiment, it is possible to obtain the effect of reducing a delay in filling at the time of imprinting, and a fall of the pattern and damage to the mold at the time of mold releasing by making the thickness of the pattern portion larger than that of the thin portion around the pattern portion.

According to the above-described various embodiments, the filling speed of the four corner portions of the pattern portion increases at the time of imprinting and it is thus possible to obtain the effect of improving the productivity. Decreasing the unfilled region produces the effect of reducing a pattern defect. Furthermore, at the time of mold releasing, it is possible to reduce the mold release force and to control the mold release speed, thereby reducing a defect such as a fall of the pattern, and damage to the mold. Therefore, according to these embodiments, the effect of reducing a pattern defect and improving the productivity can be obtained.

Method of Manufacturing Article

A method of manufacturing an article according to an embodiment of the present invention is suitable for manufacturing an article, for example, a microdevice such as a semiconductor device or an element having a microstructure. This manufacturing method includes a step of forming a pattern on a substrate by using an imprint apparatus. The manufacturing method can further include other well-known steps of processing the substrate on which the pattern is formed (for example, oxidation, deposition, vapor deposition, doping, planarization, etching, imprint material separation, dicing, bonding, and packaging). The method of manufacturing an article according to this embodiment is more advantageous than any conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A mold having a pattern and configured to transfer the pattern to an imprint material, the mold comprising:
   a pattern portion where the pattern to be transferred to the imprint material is formed; and
   a concave portion formed in an opposite side of a surface where the pattern portion is formed and having a size to include the pattern portion in a planar view,
   wherein an outer edge of the pattern portion has a rectangular shape in the planar view,
   the concave portion includes
   first respective sidewall portions along respective sides of the rectangular shape of the pattern portion in the planar view,
   second respective sidewall portions along respective sides of the rectangular shape of the pattern portion inside the first respective sidewall portions in the planar view,
   first rigid portions formed between the first respective sidewall portions and the second respective sidewall portions in the planar view on a bottom surface of the concave portion,
   the second respective sidewall portions are formed on steps of the first rigid portions, and
   the first rigid portions are thicker than a portion outside a corner of the rectangular shape of the pattern portion in the planar view.

2. The mold according to claim 1, wherein the concave portion further includes, outside each of four corners of the rectangular shape of the pattern portion, a second rigid portion whose rigidity becomes lower toward a corner of the concave portion on a bottom surface of the concave portion.

3. A mold having a pattern and configured to transfer the pattern to an imprint material, the mold comprising:
   a pattern portion where the pattern to be transferred to the imprint material is formed; and
   a concave portion formed in an opposite side of a surface where the pattern portion is formed and having a size to include the pattern portion in a planar view,
   wherein an outer edge of the pattern portion has a rectangular shape in the planar view,
   the concave portion includes respective sidewall portions along respective sides of the rectangular shape of the pattern portion in the planar view,
   a bottom portion of the concave portion includes an inclined portion whose height becomes lower toward the center of the pattern portion,
   the inclined portion is lower than bottoms of the respective sidewall portions, and
   the inclined portion includes four parts whose height become lower toward the center of the pattern portion between the center of the pattern portion and steps of four sides of the rectangular shape of the pattern portion in the planar view.

4. A mold having a pattern and configured to transfer the pattern to an imprint material, the mold comprising:
   a pattern portion where the pattern to be transferred to the imprint material is formed; and
   a concave portion formed in an opposite side of a surface where the pattern portion is formed and having a size to include the pattern portion in a planar view,
   wherein an outer edge of the pattern portion has a rectangular shape in the planar view, the concave portion includes respective sidewall portions along respective sides of the rectangular shape of the pattern portion in the planar view, a bottom portion of the concave portion includes an inclined portion whose height becomes higher toward the center of the pattern portion, and the inclined portion includes four parts whose height become higher toward the center of the pattern portion inside steps of four sides of the rectangular shape of the pattern portion in the planar view.

5. An imprint apparatus for molding an imprint material on a substrate by using a mold having a pattern and configured to transfer the pattern to the imprint material, wherein the mold includes:

a pattern portion where the pattern to be transferred to the imprint material is formed; and a concave portion formed in an opposite side of a surface where the pattern portion is formed and having a size to include the pattern portion in a planar view, wherein an outer edge of the pattern portion has a rectangular shape in the planar view, the concave portion includes first respective sidewall portions along respective sides of the rectangular shape of the pattern portion in the planar view, second respective sidewall portions along respective sides of the rectangular shape of the pattern portion inside the first respective sidewall portions in the planar view, first rigid portions formed between the first respective sidewall portions and the second respective sidewall portions in the planar view on a bottom surface of the concave portion, the second respective sidewall portions are formed on steps of the first rigid portions, and the first rigid portions are thicker than a portion outside a corner of the rectangular shape of the pattern portion in the planar view.

6. An imprint apparatus for molding an imprint material on a substrate by using a mold having a pattern and configured to transfer the pattern to the imprint material, wherein the mold includes:

a pattern portion where the pattern to be transferred to the imprint material is formed; and a concave portion formed in an opposite side of a surface where the pattern portion is formed and having a size to include the pattern portion in a planar view, wherein an outer edge of the pattern portion has a rectangular shape in the planar view, the concave portion includes respective sidewall portions along respective sides of the rectangular shape of the pattern portion in the planar view, a bottom portion of the concave portion includes an inclined portion whose height becomes lower toward the center of the pattern portion, the inclined portion is lower than bottoms of the respective sidewall portions, and the inclined portion includes four parts whose height become lower toward the center of the pattern portion between the center of the pattern portion and steps of four sides of the rectangular shape of the pattern portion in the planar view.

7. An imprint apparatus for molding an imprint material on a substrate by using a mold having a pattern and configured to transfer the pattern to the imprint material, wherein the mold includes:

a pattern portion where the pattern to be transferred to the imprint material is formed; and a concave portion formed in an opposite side of a surface where the pattern portion is formed and having a size to include the pattern portion in a planar view, wherein an outer edge of the pattern portion has a rectangular shape in the planar view, the concave portion includes respective sidewall portions along respective sides of the rectangular shape of the pattern portion in the planar view, a bottom portion of the concave portion includes an inclined portion whose height becomes higher toward the center of the pattern portion, and the inclined portion includes four parts whose height become higher toward the center of the pattern portion inside steps of four sides of the rectangular shape of the pattern portion in the planar view.

8. A mold having a pattern and configured to transfer the pattern to an imprint material, the mold comprising:

a pattern portion where the pattern to be transferred to the imprint material is formed; and a concave portion formed in an opposite side of a surface where the pattern portion is formed and having a size to include the pattern portion in a planar view, wherein an outer edge of the pattern portion has a rectangular shape in the planar view, the concave portion includes a first sidewall portion, second respective sidewall portions along respective sides of the rectangular shape of the pattern portion inside the first sidewall portion in the planar view, first rigid portions formed between the first sidewall portion and the second respective sidewall portions in the planar view on a bottom surface of the concave portion, the second respective sidewall portions are formed on steps of the first rigid portions, and the first rigid portions are thicker than a portion outside a corner of the rectangular shape of the pattern portion in the planar view.

9. An imprint apparatus for molding an imprint material on a substrate by using a mold having a pattern and configured to transfer the pattern to the imprint material, wherein the mold includes:

a pattern portion where the pattern to be transferred to the imprint material is formed; and a concave portion formed in an opposite side of a surface where the pattern portion is formed and having a size to include the pattern portion in a planar view, wherein an outer edge of the pattern portion has a rectangular shape in the planar view, the concave portion includes a first sidewall portion, second respective sidewall portions along respective sides of the rectangular shape of the pattern portion inside the first sidewall portion in the planar view, first rigid portions formed between the first sidewall portion and the second respective sidewall portions in the planar view on a bottom surface of the concave portion, the second respective sidewall portions are formed on steps of the first rigid portions, and the first rigid portions are thicker than a portion outside a corner of the rectangular shape of the pattern portion in the planar view.

* * * * *